US007706189B2

(12) United States Patent
Dong et al.

(10) Patent No.: US 7,706,189 B2
(45) Date of Patent: *Apr. 27, 2010

(54) NON-VOLATILE STORAGE SYSTEM WITH TRANSITIONAL VOLTAGE DURING PROGRAMMING

(75) Inventors: Yingda Dong, Sunnyvale, CA (US); Jeffrey W. Lutze, San Jose, CA (US); Dana Lee, Saratoga, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/753,963

(22) Filed: May 25, 2007

(65) Prior Publication Data

US 2008/0291736 A1    Nov. 27, 2008

(51) Int. Cl.
*G11C 16/04* (2006.01)
(52) U.S. Cl. .............................. 365/185.19; 365/185.17; 365/185.18
(58) Field of Classification Search ............ 365/185.19, 365/185.17, 185.18
See application file for complete search history.

(56) References Cited

U.S. PATENT DOCUMENTS

| 5,991,202 | A  | 11/1999 | Derhacobian et al. |
|-----------|----|---------|--------------------|
| 6,859,397 | B2 | 2/2005  | Lutze              |
| 6,894,931 | B2 | 5/2005  | Yaegashi           |
| 6,930,921 | B2 | 8/2005  | Matsunaga          |
| 7,020,026 | B2 | 3/2006  | Guterman           |
| 2002/0060926 | A1 | 5/2002 | Choi et al.       |
| 2008/0117684 | A1* | 5/2008 | Hemink ......... 365/185.19 |

FOREIGN PATENT DOCUMENTS

EP    0951720    5/2004

OTHER PUBLICATIONS

U.S. Appl. No. 11/426,475, filed Jun. 26, 2006, titled, "Method for programming non-volatile memory using variable amplitude programming pulses,".
U.S. Appl. No. 11/753,958, filed May 25, 2007.
Office Action dated May 11, 2009 in U.S. Appl. No. 11/753,958.
Response to Office Action filed Aug. 11, 2009 in U.S. Appl. No. 11/753,958.
Notice of Allowance and Fee(s) Due dated Sep. 29, 2009 in U.S. Appl. No. 11/753,958.

* cited by examiner

*Primary Examiner*—Huan Hoang
(74) *Attorney, Agent, or Firm*—Vierra Magen Marcus & DeNiro LLP

(57) ABSTRACT

To program one or more non-volatile storage elements, a set of programming pulses are applied to at least one selected non-volatile storage element and one or more particular unselected non-volatile storage elements, for example, via a common word line. A boosting voltage is applied to other unselected non-volatile storage elements during the programming process in order to boost the channels of the unselected non-volatile storage elements so that programming will be inhibited. Each of the programming pulses has a first intermediate magnitude, a second intermediate magnitude and a third magnitude. In one embodiment, the first intermediate magnitude is similar to or the same as the boosting voltage. The second intermediate magnitude is greater than the first intermediate magnitude, but less then the third magnitude. Such an arrangement can reduce the effects of program disturb.

21 Claims, 14 Drawing Sheets

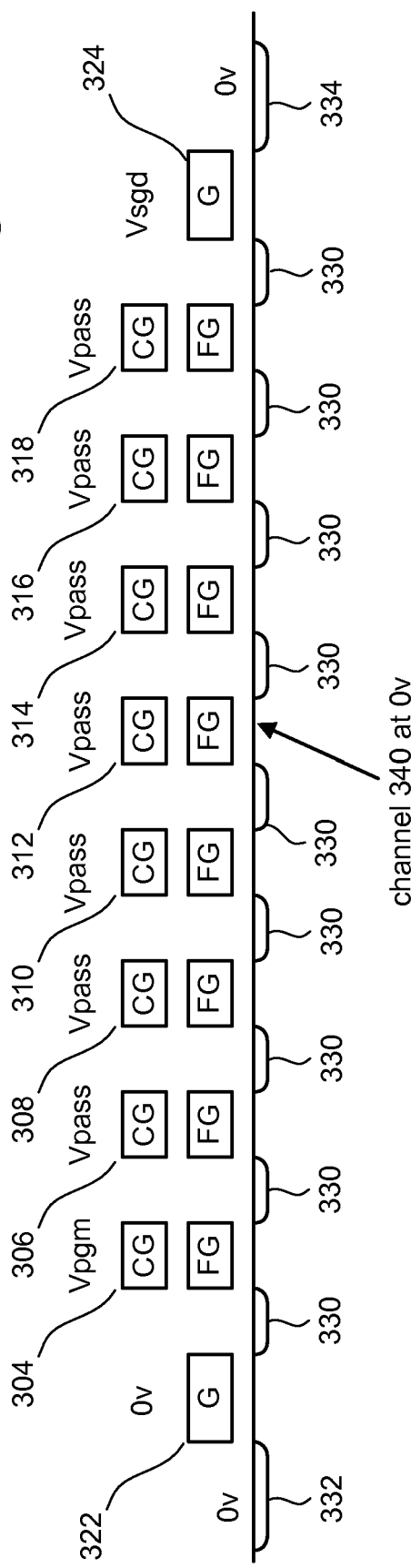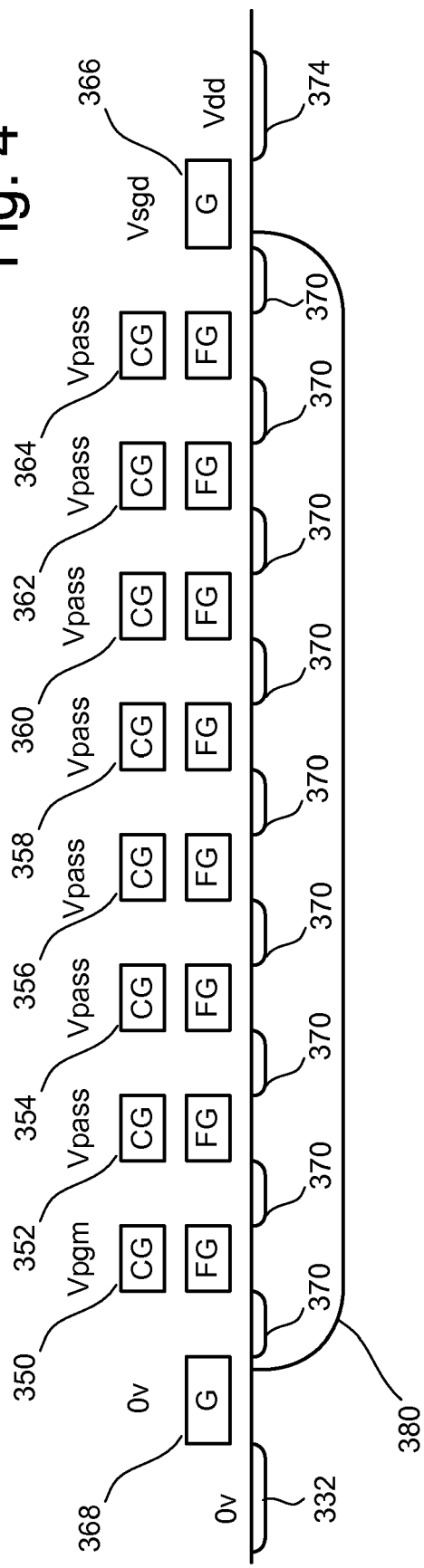

| Wordline | Upper/ Lower Page | Page |
|---|---|---|
| WL3 | upper | Page 7 |
| | lower | Page 5 |
| WL2 | upper | Page 6 |
| | lower | Page 3 |
| WL1 | upper | Page 4 |
| | lower | Page 1 |
| WL0 | upper | Page 2 |
| | lower | Page 0 |

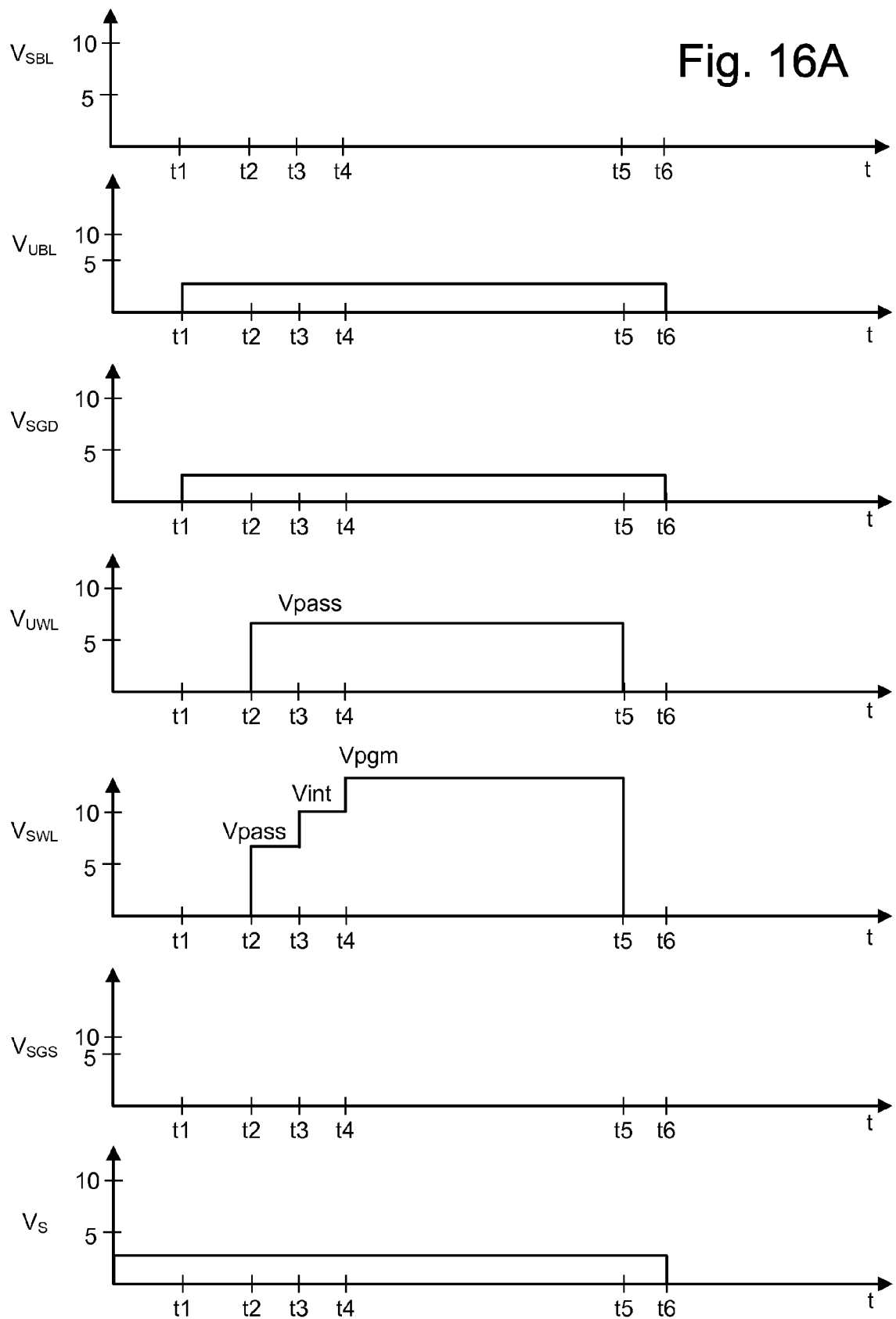

NON-VOLATILE STORAGE SYSTEM WITH TRANSITIONAL VOLTAGE DURING PROGRAMMING

CROSS-REFERENCE TO RELATED APPLICATIONS

The following application is cross-referenced and incorporated by reference herein in its entirety: U.S. patent application Ser. No. 11/753,958, entitled "Method For Using Transitional Voltage During Programming Of Non-Volatile Storage," by Yingda Dong, Jeffrey W. Lutze and Dana Lee.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Many types of EEPROM and flash memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 shows four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, or another number. The discussion herein is not limited to any particular number of memory cells in a NAND string.

A typical architecture for a flash memory system using a NAND structure will include several NAND strings. Each NAND string is connected to the source line by its source select gate controlled by a select line SGS and connected to its associated bit line by its drain select gate controlled by a select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers. The word lines (WL3, WL2, WL1 and WL0) comprise the rows of the memory array.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." If sixteen levels of information (or states) are stored in each memory cell (e.g. for four bits of data), there will be sixteen threshold voltage ranges assigned to the data values "0000", "0001", "0010", "0011" "0100", "0101", "0110" , "0111", "1000", "1001", "1010", "1011" "1100", "1101", "1110" and "1111."

Relevant examples of NAND type flash memories and their operation are provided in the following U.S. Patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

When programming a flash memory cell, a program voltage is applied to the control gate and the bit line is grounded. Due to the voltage differential between the channel of the flash memory cell and the floating gate, electrons from the channel area under the floating gate are injected into the floating gate. When electrons accumulate in the floating gate, the floating gate becomes negatively charged and the threshold voltage of the memory cell is raised. To apply the program voltage to the control gate of the cell being programmed, that program voltage is applied on the appropriate word line. That word line is also connected to one memory cell in each of the other NAND strings that utilize the same word line. A problem arises when it's desired to program one cell on a word line without programming other cells connected to the same word line. Because the program voltage is applied to all memory cells connected to a word line, an unselected memory cell (a memory cell that is not to be programmed) on the same word line may become inadvertently programmed. The unintentional programming of the unselected memory cell on the selected word line is referred to as "program disturb."

Several techniques can be employed to prevent program disturb. In one method known as "self boosting," the unselected NAND strings are electrically isolated from the corresponding bit lines and a pass voltage (e.g. 7-10 volts, but not limited to this range) is applied to the unselected word lines during programming. The unselected word lines couple to the channel area of the unselected NAND strings, causing a voltage (e.g., 6-10 volts) to exist in the channel of the unselected NAND strings, thereby reducing program disturb. Self boosting causes a boosted voltage to exist in the channel which lowers the voltage differential across the tunnel oxide and hence reduces program disturb. Note that the boosted channel voltage can vary largely since the boosted channel voltage depends on the value of the pass voltage and also on the state of the memory cells, with boosting being most efficient (highest channel voltage) when all memory cells in the NAND string are in the erased state.

FIGS. 3 and 4 depict NAND strings that are being programmed and inhibited using the self-boosting method. FIG. 3 depicts a NAND string being programmed. The NAND string of FIG. 3 includes eight memory cells 304, 306, 308, 310, 312, 314, 316 and 318. Each of those eight memory cells includes a floating gate (FG) and a control gate (CG). Between each of the floating gates are source/drain regions 330. In some implementations, there is a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. The source/drain regions 330 are N+ diffusion regions that are formed in the P-well.

At one end of the NAND string is a drain side select gate 324. The drain select gate 324 connects the NAND string to the corresponding bit line via bit line contact 334. At another end of the NAND string is a source select gate 322. Source select gate 322 connects the NAND string to a common source line 332. During programming, the memory cell selected for programming (e.g., memory cell 304) receives a program voltage Vpgm on its associated word line. The program voltage Vpgm can typically vary between 12 to 24 volts. In one embodiment, the program voltage signal is a set of pulses which increase in magnitude with each new pulse. A boosting voltage (also called a pass voltage) Vpass of approximately 8 volts is applied to the control gates of the memory cells that are not selected for programming. Source select gate 322 is in an isolating state, receiving 0 volts at its gate (G). A low voltage is applied to the common source line 332. This low voltage can be zero volts. However, the source voltage can also be slightly higher than zero volts to provide better isolation characteristics of the source side select gate. A voltage Vsgd, which is typically in the range of the power supply voltage Vdd (e.g., 2.5 volts), is applied to drain side select gate 324. Zero volts is applied to bit line contact 334 via the corresponding bit line to enable programming of the selected memory cell 312. Channel 340 is at or close to zero volts. Because of the voltage differential between the channel and the floating gate of memory cell 312, electrons tunnel through the gate oxide (also commonly referred to as tunnel oxide) into the floating gate by Fowler-Nordheim tunneling.

The NAND string of FIG. 4 depicts a NAND string being inhibited from programming. The NAND string includes eight memory cells 350, 352, 354, 356, 358, 360, 362 and 364. The NAND string also includes drain select gate 366 connecting the NAND string to the corresponding bit line via bit line contact 374, and source select gate 368 for connecting the NAND string to common source line 332. Between each of the floating gate stacks are source/drain regions 370. The NAND string of FIG. 4 has Vsgd applied to the gate of the drain select gate 366, zero volts applied to the gate of the source side select gate 368 and zero volts (or a slightly higher voltage) at the common source line 332. Bit line contact 374 receives the power supply voltage Vdd via the corresponding bit line in order to inhibit the programming of memory cell 358.

The drain select transistor 366 will initially be in a conducting state; therefore, the channel area under the NAND string will partly be charged up to a higher potential (higher than zero volts and typically equal or almost equal to Vdd). This charging is commonly referred to as pre-charging. The pre-charging will stop automatically when the channel potential has reached Vdd or a lower potential given by Vsgd-Vt, where Vt equals the threshold voltage of the drain select gate 366. In general, during pre-charging, Vsgd is chosen in such a way that Vsgd-Vt>Vdd so that the channel area under the NAND string can be pre-charged to Vdd. After the channel has reached that potential, the select gate transistor is non-conducting. Subsequently, the voltages Vpass and Vpgm are ramped up from zero volts to their respective final values (not necessarily at the same time), and because the drain side select gate transistor 366 is in a non-conducting state, the channel potential will start to rise because of the capacitive coupling between the word lines and the channel area. This phenomenon is called self boosting. The channel area under the NAND string of FIG. 4 is boosted to a boosting voltage. Because the voltage differential between the floating gate of memory cell 350 and the channel has been reduced, programming is inhibited. More information about programming NAND flash memory, including self boosting techniques, can be found in U.S. Pat. No. 6,859,397, "Source Side Self Boosting Technique for Non-Volatile Memory," Lutze at al., incorporated herein by reference in its entirety. Note that FIG. 4 shows region 380, which includes a channel area at the surface of the substrate and a depletion layer (an area with increased electrical field due to the channel that is boosted to a high voltage) under the boosted channel area. The channel area exists under each of the floating gate/control gate stacks and between the source/drain regions 370.

Another attempt to address program disturb is Erased Area Self Boosting ("EASB"). EASB attempts to isolate the channel of previously programmed memory cells from the channel of the memory cell being inhibited. In the EASB method, the channel area of the selected NAND string is divided into two areas: an area at the source side of the selected word line that can contains a number of programmed (or erased memory cells) memory cells and an area at the drain side of the selected word line in which the memory cells are still in the erased state, or at least not yet in the final programmed state. The two areas are separated by a word line that is biased to a low isolation voltage, typically zero volts. Because of this separation, the two areas can be boosted to different potentials. In almost all cases, the area at the drain side of the selected word line will be boosted to a higher potential than the area at the source side. Since the highest boosted area is the area with the erased cells, this boosting method is referred to as Erased Area Self Boosting.

Another boosting scheme, known as Revised Erased Area Self Boosting (REASB) is similar to EASB, except that between the word line receiving the isolation voltage and the selected word line is a word line receiving an intermediate voltage (between the Vpass and the isolation voltage).

Although the above boosting methods have reduced program disturb, they have not always eliminated the problem. As scaling of memory devices becomes more aggressive, the effects of program disturb become greater. Additionally, multi-state flash memory devices that require tight threshold voltage distribution may experience widening of those distributions. In particular, the word lines next to the select gates (especially next to the source select gate) are more likely to be subjected to program disturb.

One effect that can occur to the memory cell next to the source select gate (e.g., memory cell 350 is next to source select gate 368 of FIG. 4) is Gate Induced Drain Leakage (GIDL). GIDL causes the generation of electrons at the source select gate when the channel under the NAND string is inhibited from programming (boosted to a high voltage). Subsequently, the generated electrons are accelerated by an electric field towards the floating gate of the memory cell next to the source select gate. Some of the electrons can gain sufficient energy to be injected into the tunnel oxide under the floating gate or in the floating gate itself and, thus, modify the threshold voltage of the corresponding memory cell.

FIG. 5 shows a portion of the NAND string of FIG. 4 with a zooming-in on the drain of the source select gate and a portion of the channel for memory cell 350. Due to boosting of the NAND string during a program inhibit operation (for example when other NAND strings are being programmed), a high voltage is present in the channel area of the boosted NAND string. This high channel voltage is also present at the junction area between source select gate 368, which is typically biased at 0V, and memory cell 350 next to source select gate 368. This bias condition may cause the creation of electron-hole pairs. The holes will go to P-well area 384. The electrons will move to the boosted channel area. As a result, there is a current from the from the drain to P-well area 384. This current is referred to as GIDL.

In general, there is a vertical electric field present based on the voltage applied to the control gate of memory cell 350. The electrons can be accelerated in the electric field and may gain enough energy to be injected into the tunnel oxide of memory cell 350 or may be injected into the floating gate of memory cell 350. In both cases, the threshold voltage of memory cell 350 will change due to the presence of the injected electrons, thereby, risking an error when reading memory cell 350.

SUMMARY OF THE INVENTION

Technology is described herein for reducing program disturb. A programming voltage signal is used that first ramps to a intermediate voltage prior to applying the programming voltage. This intermediate voltage is larger than the pass voltage applied to unselected memory cells but smaller than the programming voltage. Since the voltage is larger than the pass voltage, a current may flow due to GIDL. However, because the intermediate voltage is lower than the programming voltage, there is less of a risk that electrons will be injected into the tunnel oxide or floating gate of a memory cell that has not been selected for programming.

One embodiment includes applying a programming signal to a selected non-volatile storage element and a particular unselected non-volatile storage element, adjusting the programming signal to a first level and holding the programming signal at the first level for a first period of time, adjusting the programming signal to a second level and holding the programming signal at the second level for a second period of time, adjusting the programming signal to a third level to cause the selected non-volatile storage element to experience programming, and applying other signals at a magnitude lower than the second level to other unselected non-volatile storage elements while the programming signal is at the second level and the third level. The application of the programming signal at the first level and at the second level does not intentionally cause programming of the selected non-volatile storage element.

One embodiment includes applying a set of voltage pulses to a selected non-volatile storage element and a particular unselected non-volatile storage element, and applying other signals to other unselected non-volatile storage elements. Each pulse has a first portion with a first magnitude and a second portion with a second magnitude. The first magnitude increase with each successive pulse. The second magnitude increases with each successive pulse. The first magnitude is not large enough to intentionally cause programming of the selected non-volatile storage element. The second magnitude is large enough to cause programming of the selected non-volatile storage element. In some implementations, the second magnitude increases at the same rate as the first magnitude so that the difference between the first magnitude and the second magnitude remains constant for all (or a subset) of the pulses.

One embodiment includes applying a set of pulses to a selected non-volatile storage element and a particular unselected non-volatile storage element. Other signals are applied to other unselected non-volatile storage elements at a magnitude lower than the second intermediate magnitude while applying the second magnitude to the selected non-volatile storage element. Each pulse has a first intermediate magnitude, a second intermediate magnitude, and a target magnitude. The target magnitude increases for at least a subset of successive pulses. The second intermediate magnitude is greater than the first intermediate magnitude and less than the target magnitude. The first intermediate magnitude is not large enough to intentionally cause programming of the selected non-volatile storage element. The second intermediate magnitude is not large enough to cause intentionally programming of the selected non-volatile storage element. The selected non-volatile storage element experiences programming in response to the target magnitude.

Some example implementations comprise a plurality of non-volatile storage elements and one or more managing circuits in communication with the non-volatile storage elements. The one or more managing circuits perform the processes discussed herein.

One embodiment comprises a plurality of non-volatile storage elements and one or more managing circuits in communication with the non-volatile storage elements. The plurality of non-volatile storage elements include a selected non-volatile storage element, a particular unselected non-volatile storage element, and other unselected non-volatile storage elements. The one or more managing circuits apply a set of pulses to the selected non-volatile storage element and the particular unselected non-volatile storage element. Each pulse has a first portion with a first magnitude and a second portion with a second magnitude. The one or more managing circuits increase the first magnitude and the second magnitude with each successive pulse. The first magnitude is not large enough to intentionally cause programming of the selected non-volatile storage element. The second magnitude is large enough to cause programming of the selected non-volatile storage element. The one or more managing circuits apply other signals to other unselected non-volatile storage elements.

One embodiment comprises a plurality of non-volatile storage elements and one or more managing circuits in communication with the non-volatile storage elements. The plurality of non-volatile storage elements include a selected non-volatile storage element, a particular unselected non-volatile storage element, and other unselected non-volatile storage elements. The one or more managing circuits apply a set of pulses to the selected non-volatile storage element and the particular unselected non-volatile storage element. Each pulse has a first intermediate magnitude, a second intermediate magnitude, and a target magnitude. The second intermediate magnitude is greater than the first intermediate magnitude and less than the target magnitude. The one or more managing circuits increase the target magnitude for at least a subset of successive pulses. The first intermediate magnitude and the second intermediate magnitude are not large enough to intentionally cause programming of the selected non-volatile storage element. The selected non-volatile storage element experiences programming in response to the target magnitude. The one or more managing circuits apply other signals at a magnitude lower than the second intermediate magnitude to the other unselected non-volatile storage elements while applying the second intermediate magnitude during the pulses.

One embodiment comprises a plurality of non-volatile storage elements and one or more managing circuits in communication with the non-volatile storage elements. The plurality of non-volatile storage elements include a selected non-volatile storage element, a particular unselected non-volatile storage element, and other unselected non-volatile storage elements. The one or more managing circuits apply a programming signal to the selected non-volatile storage element and the particular unselected non-volatile storage element. The application of the programming signal includes adjusting the programming signal to a first level, holding the programming signal at the first level for a first period of time, adjusting the programming signal to a second level, and holding the programming signal at the second level for a second period of time. The one or more managing circuits do not intentionally cause programming of the selected non-volatile storage element when applying the programming signal at the first level and at the second level. The application of the programming signal further includes adjusting the programming signal to a third level to intentionally cause the selected non-volatile storage element to experience programming. The one or more managing circuits apply other signals at a magnitude lower than the second level to the other unselected non-volatile storage elements while applying the programming signal at the second level.

BRIEF DESCRIPTION OF THE DRAWINGS

FIG. 3 depicts a NAND string and a set of voltages applied to the NAND string during a programming operation.
FIG. 4 depicts a NAND string and a set of voltages applied to the NAND string during a programming operation.
FIG. 16A is a timing diagram that explains the behavior of certain signals during a programming operations.

DETAILED DESCRIPTION

One example of a memory system suitable for implementing the present invention uses the NAND flash memory structure. However, other types of non-volatile storage devices can also be used.

Figure 6:
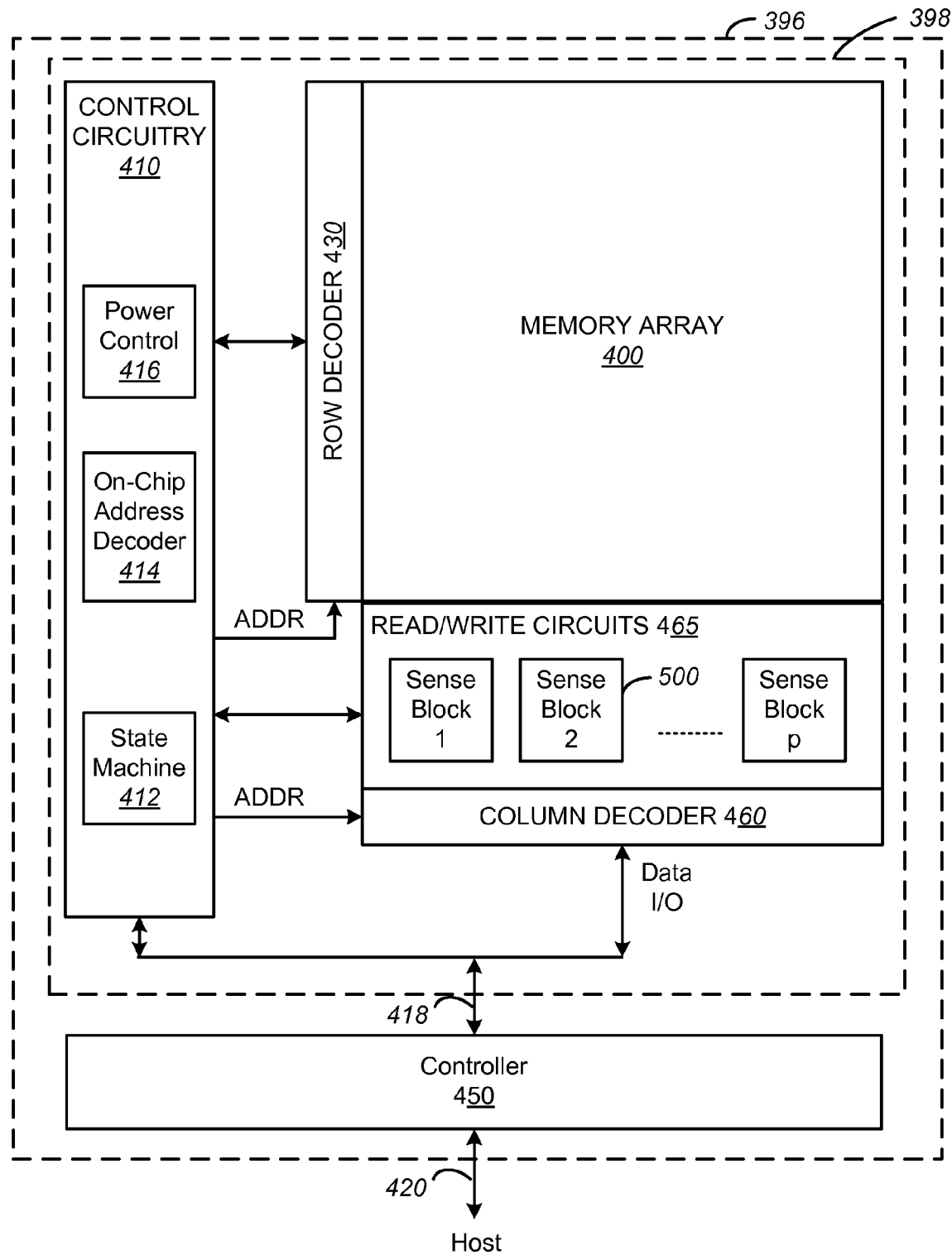
FIG. 6 is a block diagram of a non-volatile memory system.

FIG. 6 illustrates a memory device 396 having read/write circuits for reading and programming a page of memory cells in parallel, according to one embodiment. Memory device 396 may include one or more memory die 398. Memory die 398 includes a two-dimensional array of memory cells 400, control circuitry 410, and read/write circuits 465. In some embodiments, the array of memory cells can be three dimensional. Memory array 400 is addressable by word lines via row decoder 430 and by bit lines via column decoder 460. Read/write circuits 465 include multiple sense blocks 500 and allow a page of memory cells to be read or programmed in parallel. A controller 450 can be included in the same memory device 396 (e.g., a removable storage card) as the one or more memory die 398. Commands and Data are transferred between the host and controller 450 via lines 420 and between the controller and the one or more memory die 398 via lines 418.

Control circuitry 410 cooperates with the read/write circuits 465 to perform memory operations on the memory array 400. Control circuitry 410 includes a state machine 412, an on-chip address decoder 414 and a power control module 416. State machine 412 provides chip-level control of memory operations. On-chip address decoder 414 provides an address interface between that used by the host or a memory controller to the hardware address used by the decoders 430 and 460. Power control module 416 controls the power and voltages supplied to the word lines and bit lines during memory operations. In one embodiment, power control module includes one or more voltage providing circuits that can receive a base voltage (e.g., Vdd power supply or other voltage) and generate any of the voltages described herein. One example of a voltage providing circuit is a charge pump.

In some implementations, some of the components of FIG. 6 can be combined. In various designs, one or more of the components of FIG. 6 (alone or in combination), other than memory cell array 400, can be thought of as a managing circuit. For example, a managing circuit may include any one of or a combination of control circuitry 410, state machine 412, decoders 414/460, power control 416, sense blocks 500, read/write circuits 465, controller 450, etc. A memory system can include one or more managing circuits.

Figure 7:
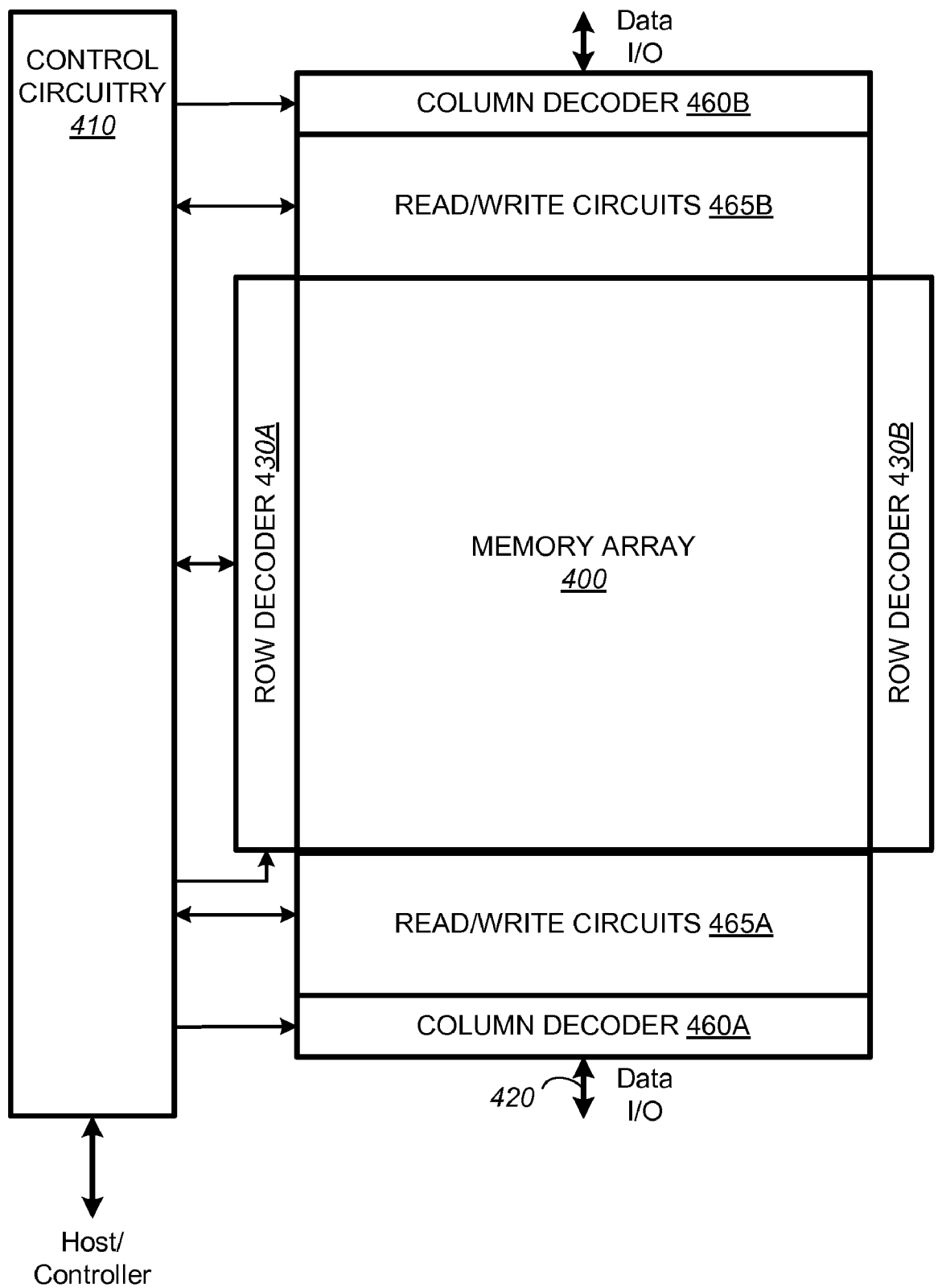
FIG. 7 is a block diagram of a non-volatile memory system.

FIG. 7 illustrates another arrangement of the memory device 396 shown in FIG. 6. Access to the memory array 400 by the various peripheral circuits is implemented in a symmetric fashion, on opposite sides of the array, so that the densities of access lines and circuitry on each side are reduced by half. Thus, the row decoder is split into row decoders 430A and 430B and the column decoder into column decoders 460A and 460B. Similarly, the read/write circuits are split into read/write circuits 465A connecting to bit lines from the bottom and read/write circuits 465B connecting to bit lines from the top of the array 400. In this way, the density of the read/write modules is essentially reduced by one half. The device of FIG. 7 can also include a controller, as described above for the device of FIG. 6.

Figure 8:
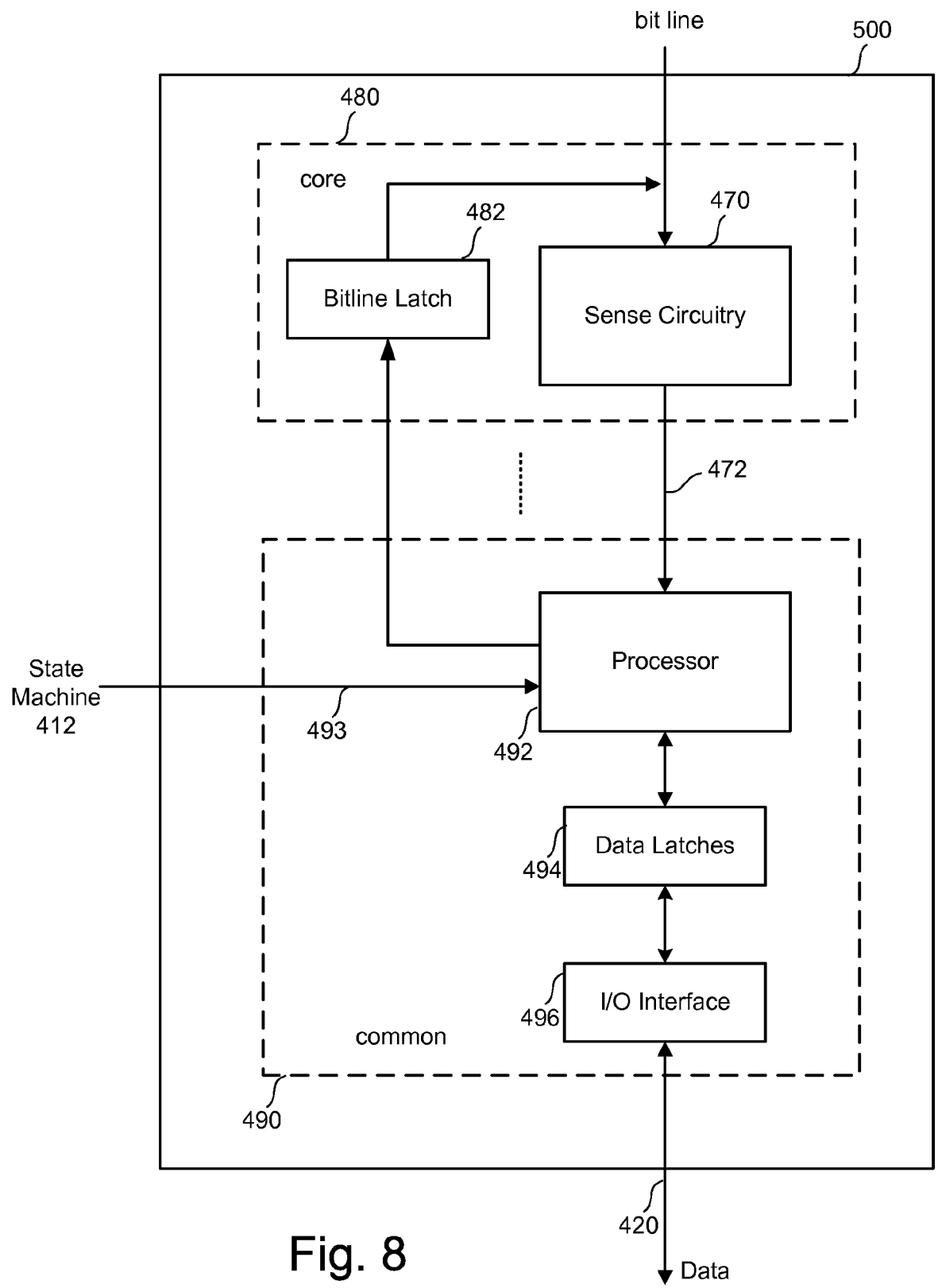
FIG. 8 is a block diagram depicting one embodiment of the sense block.

FIG. 8 is a block diagram of an individual sense block 500 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 20060140007, which is incorporated herein by reference in its entirety.

Sense module 480 comprises sense circuitry 470 that determines whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 412 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 8) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine needs to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if programming pulses appear on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three data latches per sense module 480. In some implementations (but not required), the data latches are implemented as a shift register so that the parallel data stored therein is converted to serial data for data bus 420, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cemea, filed on Dec. 28, 2005. All five of the immediately above-listed patent documents are incorporated herein by reference in their entirety.

Figure 9:
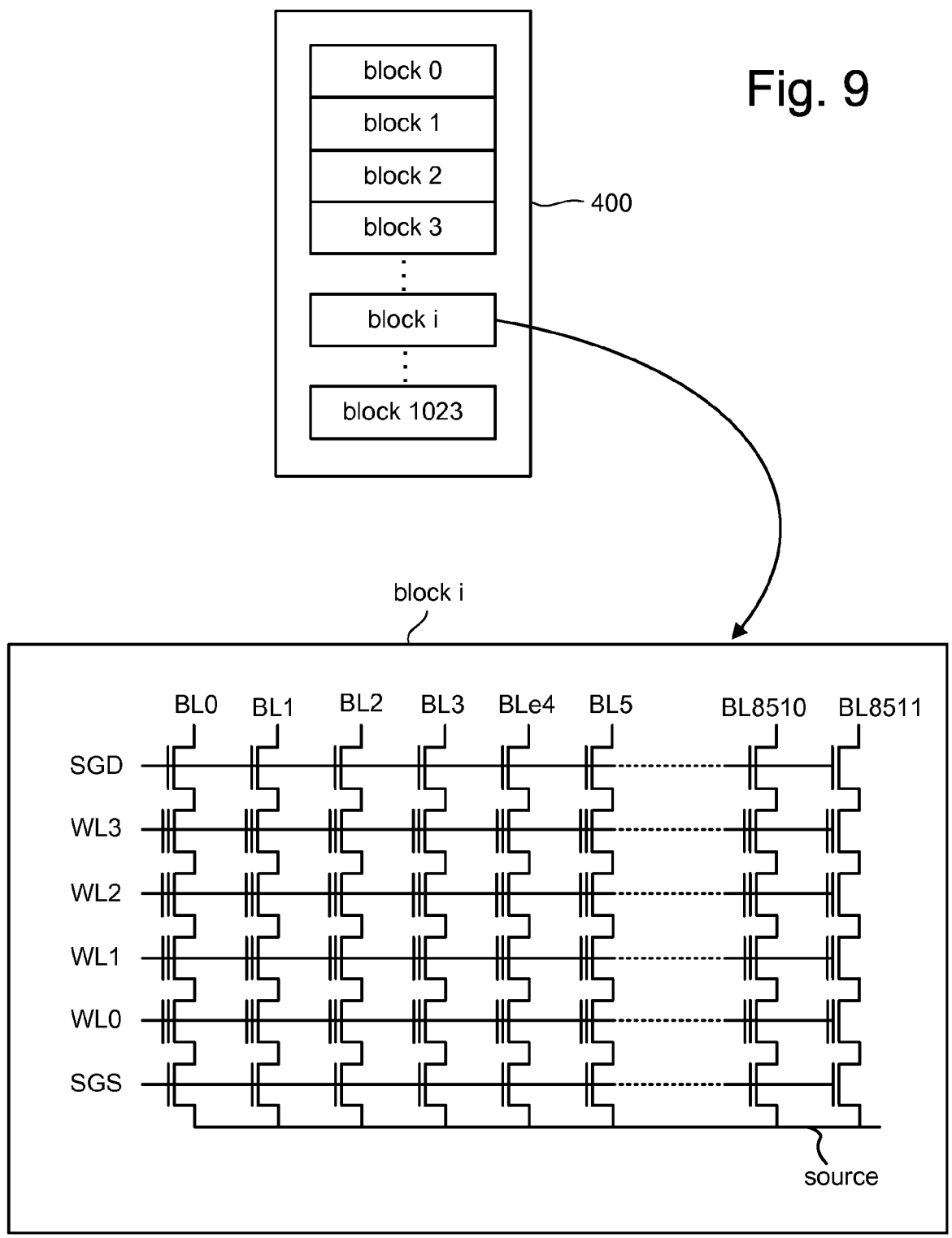
FIG. 9 is a block diagram depicting one embodiment of a memory array.

FIG. 9 depicts an exemplary structure of memory cell array 400 is described. In one embodiment, the array of memory cells is divided into a large number of blocks of memory cells. As is common for flash EEPROM systems, the block is the unit of erase. That is, each block contains the minimum number of memory cells that are erased together. In other embodiments, other units of erase may also be used.

Each block is typically divided into a number of pages. A page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In other embodiments, memory cells can be programmed in units other than pages.

As one example, a NAND flash EEPROM is depicted in FIG. 9 that is partitioned into 1,024 blocks. In each block, in this example, there are 8,512 columns corresponding to bit lines BL0, BL1, . . . BL8511. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 9 shows four memory cells connected in series to form a NAND string. Although four memory cells are shown to be included in each NAND string, more or less than four can be used (e.g., 16, 32, 64, 128, or another number or memory cells can be on a NAND string). One terminal of the NAND string is connected to a corresponding bit line via a drain select gate (connected to select gate drain line SGD), and another terminal is connected to a common source line via a source select gate (connected to select gate source line SGS).

Figures 10, 12:
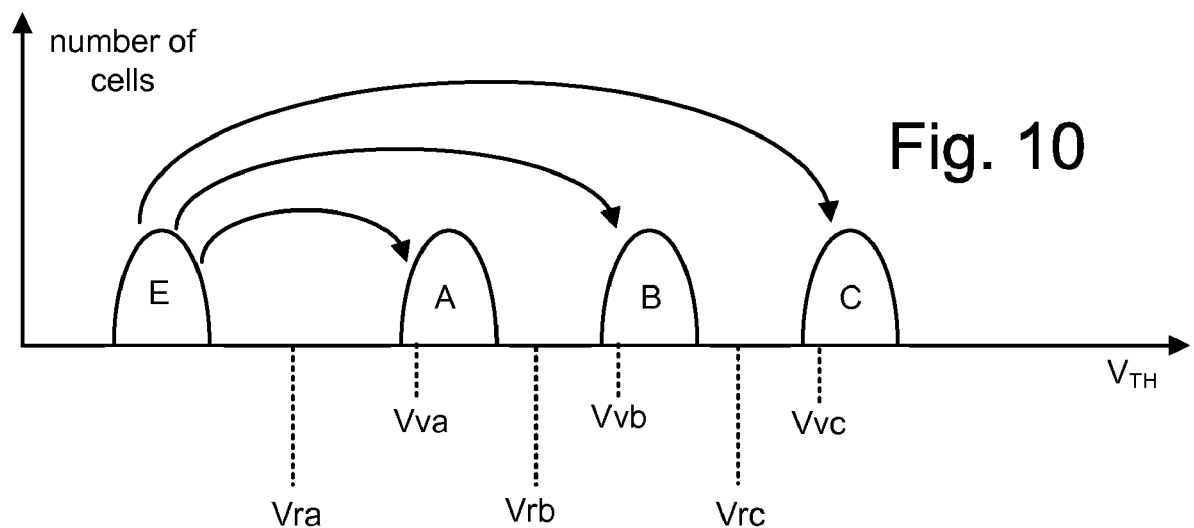
FIG. 10 depicts an example set of threshold voltage distributions and describes a process for programming non-volatile memory.
FIGS. 12 is a table depicting the order of programming non-volatile memory in one embodiment.

At the end of a successful programming process (with verification), the threshold voltages of the memory cells should be within one or more distributions of threshold voltages for programmed memory cells or within a distribution of threshold voltages for erased memory cells, as appropriate. FIG. 10 illustrates example threshold voltage distributions for the memory cell array when each memory cell stores two bits of data. Other embodiments, however, may use more or less than two bits of data per memory cell. FIG. 10 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 10 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present invention can also be used with other multi-state structures including those that include more or less than four states. For example, if each memory cell stores three bits of data, eight states will be used. If each memory cell stores four bits of data, sixteen states will be used.

FIG. 10 also shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 10 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C. Full sequence programming is graphically depicted by the three curved arrows of FIG. 10.

Figure 11A:
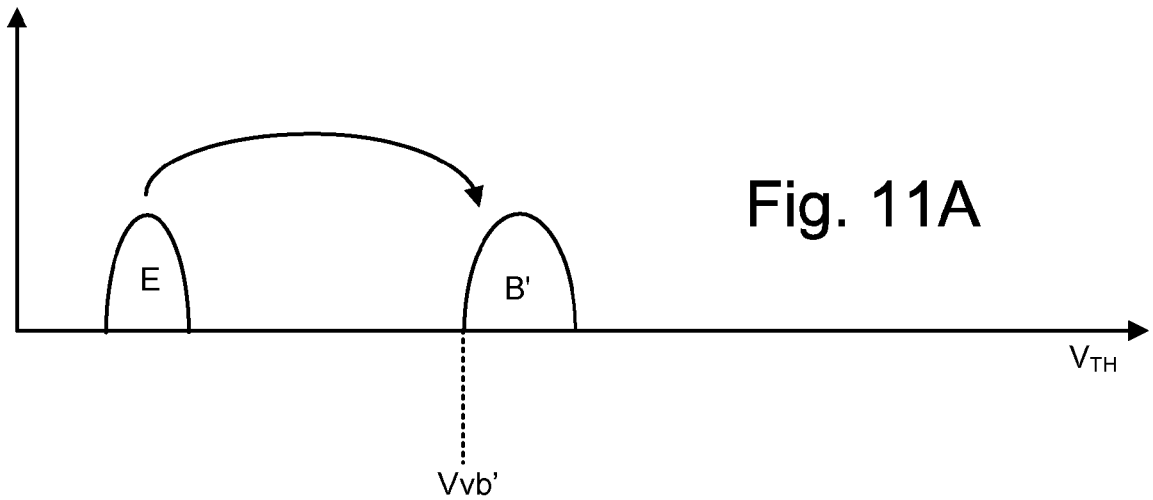
FIGS. 11A-C show various threshold voltage distributions and describe a process for programming non-volatile memory.
Figure 11B:
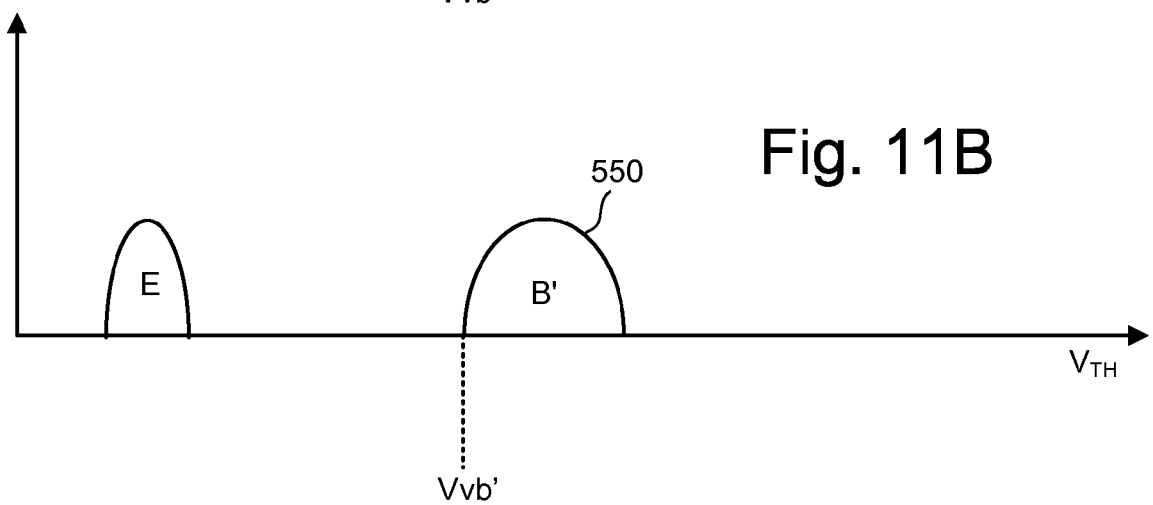
Figure 11C:
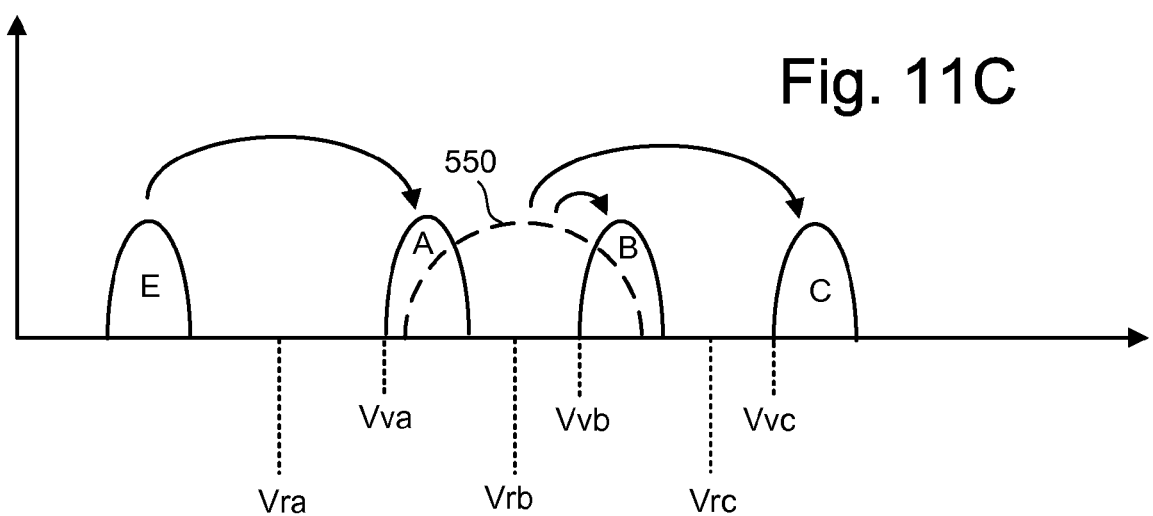

FIGS. 11A-C illustrates an example of a multi-pass technique of programming a multi-state memory cell that stores data for two different pages: a lower page and an upper page. The process of FIGS. 11A-C reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 11A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIGS. 11A-C, the upper page stores bit 0 and the lower page stores bit 1. With reference to state B, the upper page stores bit 1 and the lower page stores bit 0. With reference to state C, both pages store bit data 0.

The programming process of FIGS. 11A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 11A therefore shows the programming of memory cells from state E to state B'. State B' depicted in FIG. 11A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, after the lower page for a memory cell connected to WL0 is programmed, the lower page for a memory cell (the neighbor memory cell) on the same NAND string but connected to WL1 would be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted in FIG. 11B. This apparent widening of the threshold voltage distribution will be remedied when programming the upper page.

FIG. 11C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 11A-C reduces the effect of coupling between floating gates because only the upper page programming of neighbor memory cells will have an effect on the apparent threshold voltage of a given memory cell.

FIG. 12 is a table that describes one embodiment of the order for programming memory cells utilizing the programming method of FIGS. 11A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

Although FIGS. 11A-C provide an example with respect to four data states and two pages of data, the concepts taught by FIGS. 11A-C can be applied to other implementations with more or less than four states, different than two pages, and/or other data encodings. Other examples of programming technology can be found in United States Patent Application Publication US 2006/0140011 and U.S. patent application Ser. No. 11/694,987, "Multiple Pass Write Sequence For Non-Volatile Storage," filed on Mar. 31, 2007, both of which are incorporated herein by reference in their entirety.

In some embodiments, data is programmed to memory cells along a common word line. Thus, prior to applying the program pulses, one of the word lines is selected for programming. This word line will be referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 is the selected word line, then WL1 is the source side neighboring word line and WL3 is the drain side neighboring word line. In some embodiment, a block of memory cells are programmed from the source to the drain side. For example, memory cells connected to WL0 are programmed first, followed by programming memory cells on WL1, followed by programming memory cells on WL2, etc. As explained above, FIG. 12 describes a slight variation on this order that still generally programs from the source side to the drain side.

Figure 13:
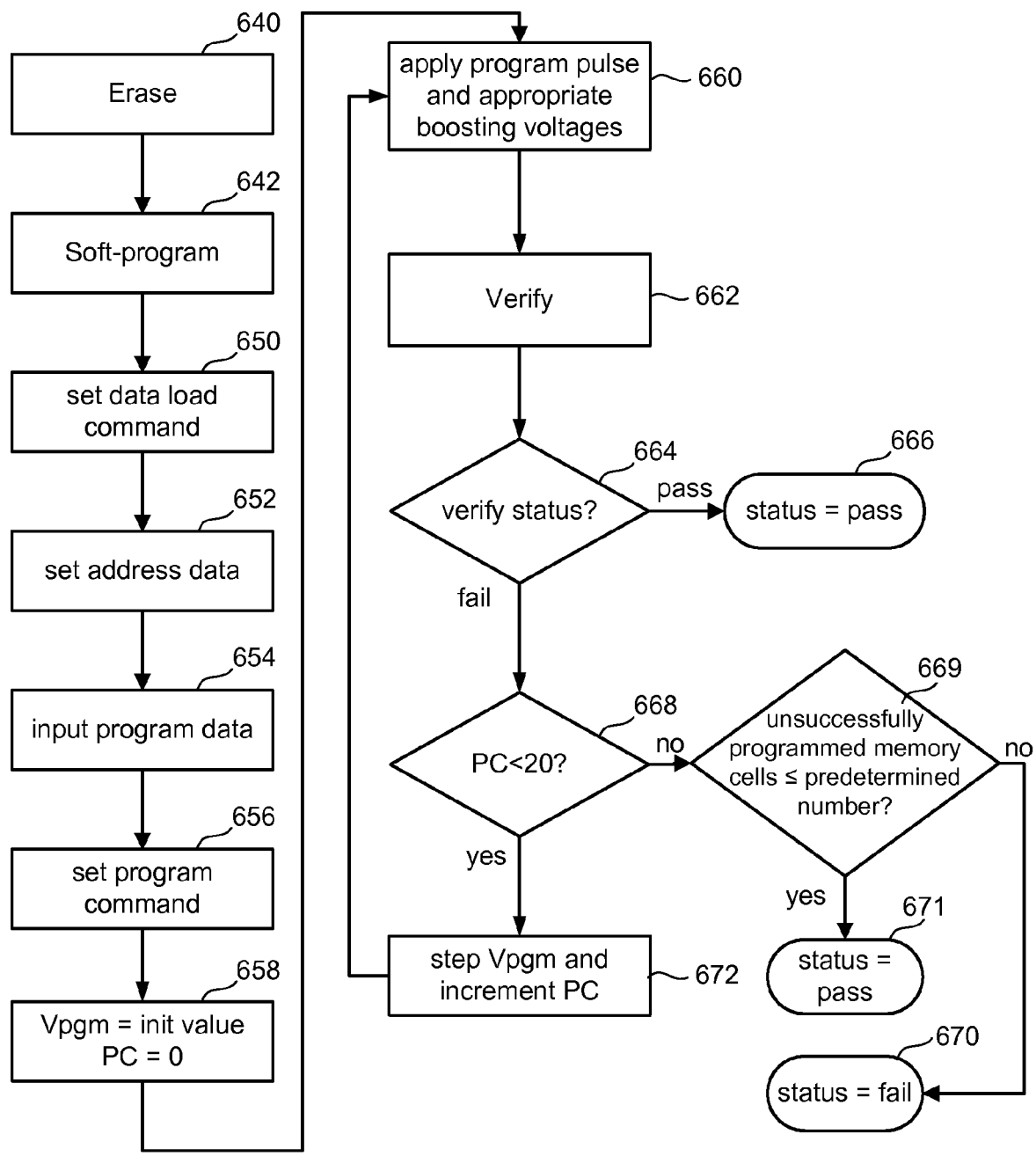
FIG. 13 is a flow chart describing one embodiment of a process for programming non-volatile memory.

FIG. 13 is a flow chart describing a programming process for programming memory cells connected to a selected word line. In one embodiment, the process of FIG. 13 is used to program one page of data. Thus, the process of FIG. 13 can be used to implement the full sequence programming of FIG. 10 or one pass (either upper page or lower page) of FIGS. 11A-C and 12. Because a programming process may include programming multiple pages, the programming process may include performing the process of FIG. 13 multiple times.

In one implementation of the process of FIG. 13, memory cells are erased (in blocks or other units) prior to programming (step 640). Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. After a block of memory cells is erased, the various memory cells can be programmed or partially programmed as described herein. Note that the erasing that is performed in step 640 would not need to be performed before each word line of a block is programmed. Rather, the block can be erased and then each word line can be programmed without erasing between the programming of the word lines.

At step 642, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 650, a "data load" command is issued by controller 450 and input to state machine 412. At step 652, address data designating the page address is provided to the decoder. At step 654, a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations. At step 656, a "program" command is received from controller 450 and provided to state machine 412.

Triggered by the "program" command, the data latched in step 654 will be programmed into the selected memory cells controlled by state machine 412 using the pulses applied to the appropriate word line. At step 658, Vpgm, the programming signal (e.g., a series of voltage pulses) is initialized to the starting magnitude (e.g., ~12V or another suitable level) and a program counter PC maintained by state machine 412 is initialized at 0. At step 660, a pulse of the program signal Vpgm is applied to the selected word line. The unselected word lines receive one or more boosting voltages, referred to as Vpass (see FIGS. 3 and 4). If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming. Note that the programming signal includes a set of voltage pulses, where the magnitude of the pulses increases with each successive pulse. In between voltage pulses are a set of verify pulses.

At step 662, the states of the selected memory cells are verified using the appropriate set of target levels, as discussed above. If it is detected that the threshold voltage of a selected cell has reached the appropriate target level, then the data stored in the corresponding data latch is changed to a logic "1." If it is detected that the threshold voltage has not reached the appropriate target level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 664, it is checked whether all of the data latches are storing logic "1." If so, the programming process is complete and successful because all selected memory cells were programmed and verified to their target states. A status of "PASS" is reported at step 666. Note that in some implementations, at step 664 it is checked whether at least a predetermined number of data latches are storing a logic "1." This predetermined number can be less than the number of all data latches, thereby allowing the programming process to stop before all memory cells have reached their appropriate verify levels. The memory cells that are not successfully programmed can be corrected using error correction during the read process.

If, at step 664, it is determined that not all of the data latches are storing logic "1," then the programming process continues. At step 668, the program counter PC is checked against a program limit value. One example of a program limit value is 20; however, other values can be used in various implementations. If the program counter PC is not less than the program limit value, then it is determined at step 669 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 671. In many cases, the memory cells that are not successfully programmed can be corrected using error correction during the read process. If however, the number of unsuccessfully programmed memory cells is greater than the predetermined number, the program process is flagged as failed and a status of FAIL is reported at step 670. If in step 668 it is determined that the program counter PC is less than the program limit value (e.g., 20), then the magnitude of the next Vpgm voltage pulse is increased by the step size (e.g., 0.2-0.4 volt step size) and the program counter PC is incremented at step 672. After step 672, the process loops back to step 660 to apply the next Vpgm voltage pulse.

In general, during verify operations (such as the verify operations performed during step 662 of FIG. 13) and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

Figure 14A:
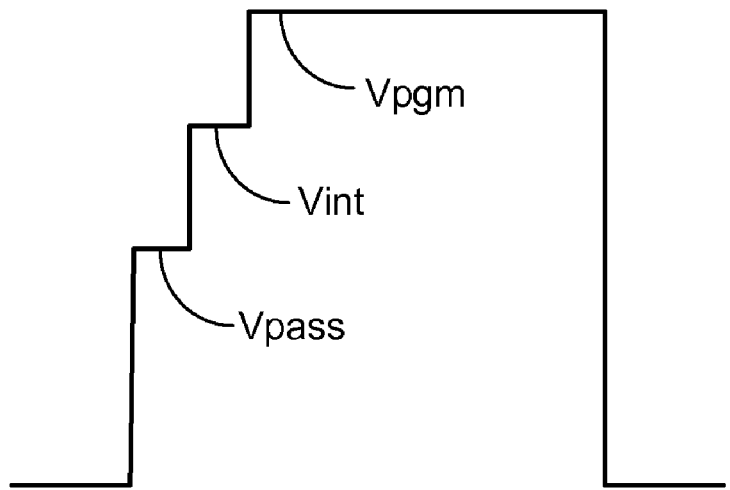
FIG. 14A depicts a programming pulse.
Figure 14B:
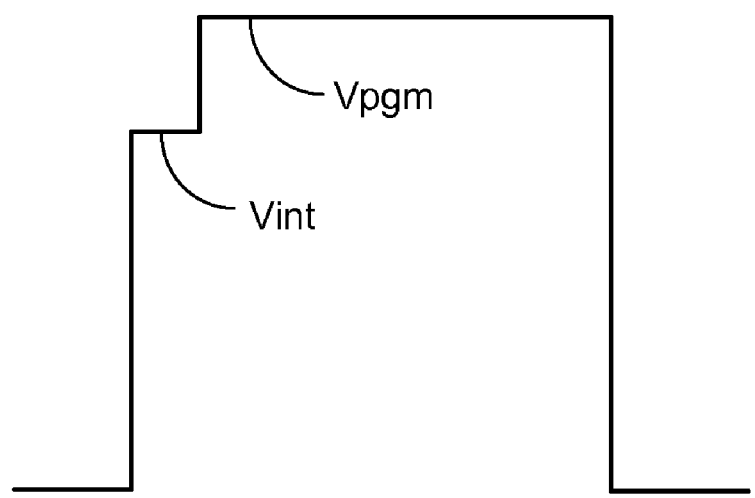
FIG. 14B depicts a programming pulse.

As described above, the programming signal applied to the selected word lines includes a set of voltage pulses. FIGS. 14A and 14B provide two embodiments of voltage pulses. The voltage pulse of FIG. 14A has three portions: a first portion at a first magnitude of Vpass, a second portion at a second magnitude of Vint, and a third portion at a third magnitude of Vpgm. Vpass is the voltage also applied to the unselected word lines. Vpass is low enough to not intentionally cause programming of the memory cells receiving Vpass at their control gates. Vpgm is the target magnitude of the voltage pulse based on the step size (see step 672 of FIG. 13). Vint is an intermediate voltage set so that it is not high enough to intentionally cause programming of the memory cells receiving Vint at their control gates. The programming pulse has a magnitude of Vpass for a first period of time, a magnitude of Vint for a second period of time and a magnitude of Vpgm for a third period of time. After the third period of time, the magnitude of the signal is reduced to zero volts (or near zero volts) or to another value. In one embodiment, the third period of time is longer than the first period of time and/or the second period of time. In one embodiment, Vint is 3-4 volts lower than Vpgm.

FIG. 14B depicts a voltage that has a magnitude of Vint for a period of time and a magnitude of Vpgm for a period of time. In one embodiment, the period of time at Vpgm is longer than the period of time at Vint.

Figure 15A:
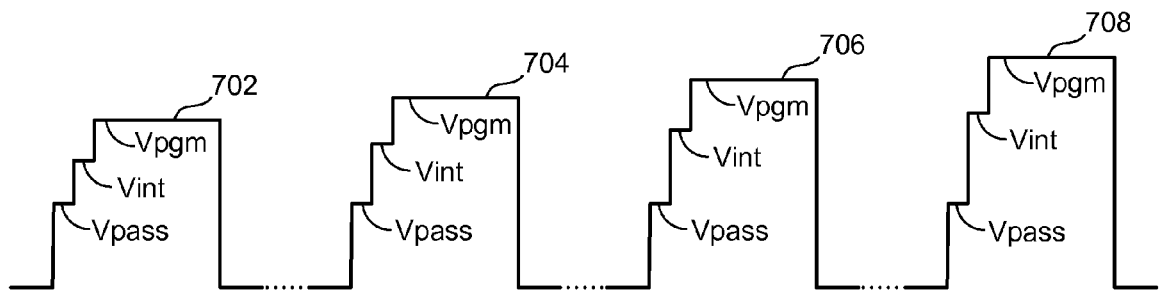
FIG. 15A depicts a programming signal that comprises multiple programming pulses.

The programming signal applied to the selected word line is a series of pulses of which the magnitude increase for successive pulses. FIG. 15A shows a portion of programming signal having a series of pulses in the form of the pulse of FIG. 14A, where the magnitude increases for successive pulses. For example, FIG. 15A shows pulses 702, 704, 706 and 708. Between each of the pulses are verify pulses (which are not depicted in the figures). All four pulses 702, 704, 706 and 708 have the three magnitudes (Vpass, Vint and Vpgm). Vpgm increases by a step size (e.g., 0.1-0.4 volts) for each pulse. In one embodiment, Vint also increases by the same step size for each pulse so that the difference between Vpgm and Vint remains constant for all of the pulses. Vpass is the same for all of the pulses.

For example, if the step size is 0.2 volts, then Vpgm for pulse 708 will be 0.6 volts larger than Vpgm for pulse 702 and Vint for pulse 708 will be 0.6 volts larger than Vint for pulse 702. Similarly, Vpgm for pulse 706 will be 0.2 volts larger than Vpgm for pulse 704 and Vint for pulse 706 will be 0.2 volts larger than Vint for pulse 704.

Figure 15B:
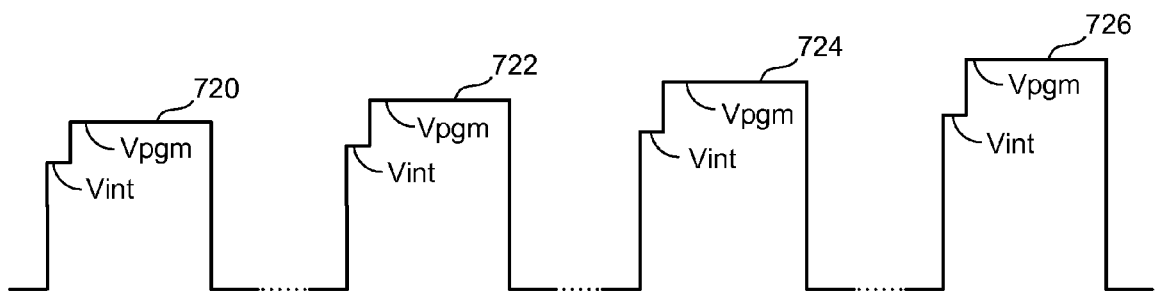
FIG. 15B depicts a programming signal that comprises multiple programming pulses.

FIG. 15B shows a portion of programming signal having a series of pulses in the form of the pulse of FIG. 14B, where the magnitude increases for successive pulses. For example, FIG. 15B shows pulses 720, 722, 724 and 726. Between each of the pulses are verify pulses (which are not depicted in the figures). All four pulses 720, 722, 724 and 726 have the two magnitudes (Vint and Vpgm). Vpgm increases by the step size for each pulse. In one embodiment, Vint also increases by the same step size for each pulse so that the difference between Vpgm and Vint remains constant for all of the pulses.

FIG. 16A is a timing diagram describing one example of the timing for applying the various signals used during programming. In one embodiment, FIG. 16A depicts the operation during one iteration of step 660 of FIG. 13. FIG. 16A shows one programming pulse and associated signals, for the programming pulse of FIG. 14A. FIG. 16A shows the bit line voltage $V_{UBL}$, for bit lines that are not selected for programming, being at Vdd (e.g., 2.5 volts) from t1 to t6. Setting the bit line voltage to Vdd inhibits the NAND string associated with that particular bit line due to boosting, as explained above. The bit line voltage $V_{SBL}$, for bit lines that are selected for programming, is set at 0 volts. The select gate voltage $V_{SGD}$ (the voltage at the control gate of the select transistor SGD) is set at Vdd from t1 to t6. In an alternative embodiment, the select gate voltage $V_{SGD}$ is raised to 5 volts at t1 and then lowered to Vdd at t2, where it remains until t6. The period when $V_{SGD}$ is at 5 volts, between t1 and t2, is optionally used to increase the pre-charge voltage level of the NAND string. The control gate of the source side select gate ($V_{SGS}$) is at 0 volts throughout and the source voltage $V_S$ is raised to Vdd at prior to t1 and remains there until t6.

The voltage on the unselected word lines $V_{UWL}$ is raised to Vpass at t2 to boost the NAND string associated with the unselected bit lines. $V_{UWL}$ is lowered to 0 volts at t5. In the embodiment where select gate voltage $V_{SGD}$ is raised to 5 volts at t1 and then lowered to Vdd at t2, $V_{UWL}$ is raised to Vdd at t1 to allow pre-charging and then is raised to Vpass at t2.

The voltage $V_{SWL}$ on the selected word line is raised to Vpass at t2 as the voltage applied to the selected word lines is also raised to Vpass t2. At t3, the voltage $V_{SWL}$ on the selected word line is raised to Vint. At t4, the voltage $V_{SWL}$ on the selected word line is raised to Vpgm, which is the target magnitude of the programming pulse. $V_{SWL}$ is lowered to 0 volts at t5. As can be seen from FIG. 16, Vpgm>Vint>Vpass. In the embodiment where select gate voltage $V_{SGD}$ is raised to 5 volts at t1 and then lowered to Vdd at t2, $V_{SWL}$ is raised to Vdd at t1 to allow pre-charging and then is raised to Vpass at t2.

Figure 16C:
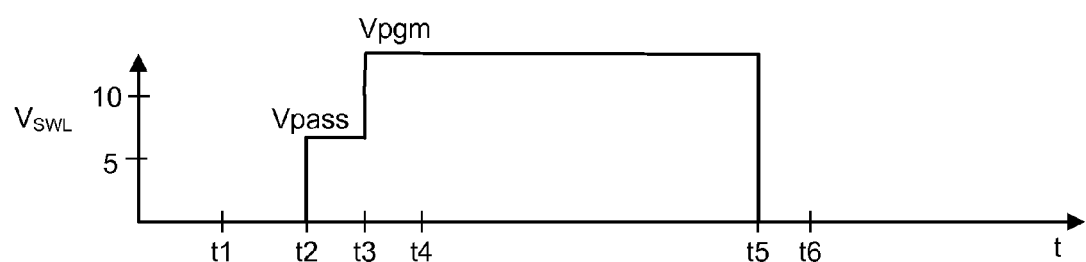
FIG. 16C is a timing diagram that explains the behavior of a programming signal.
Figure 16B:
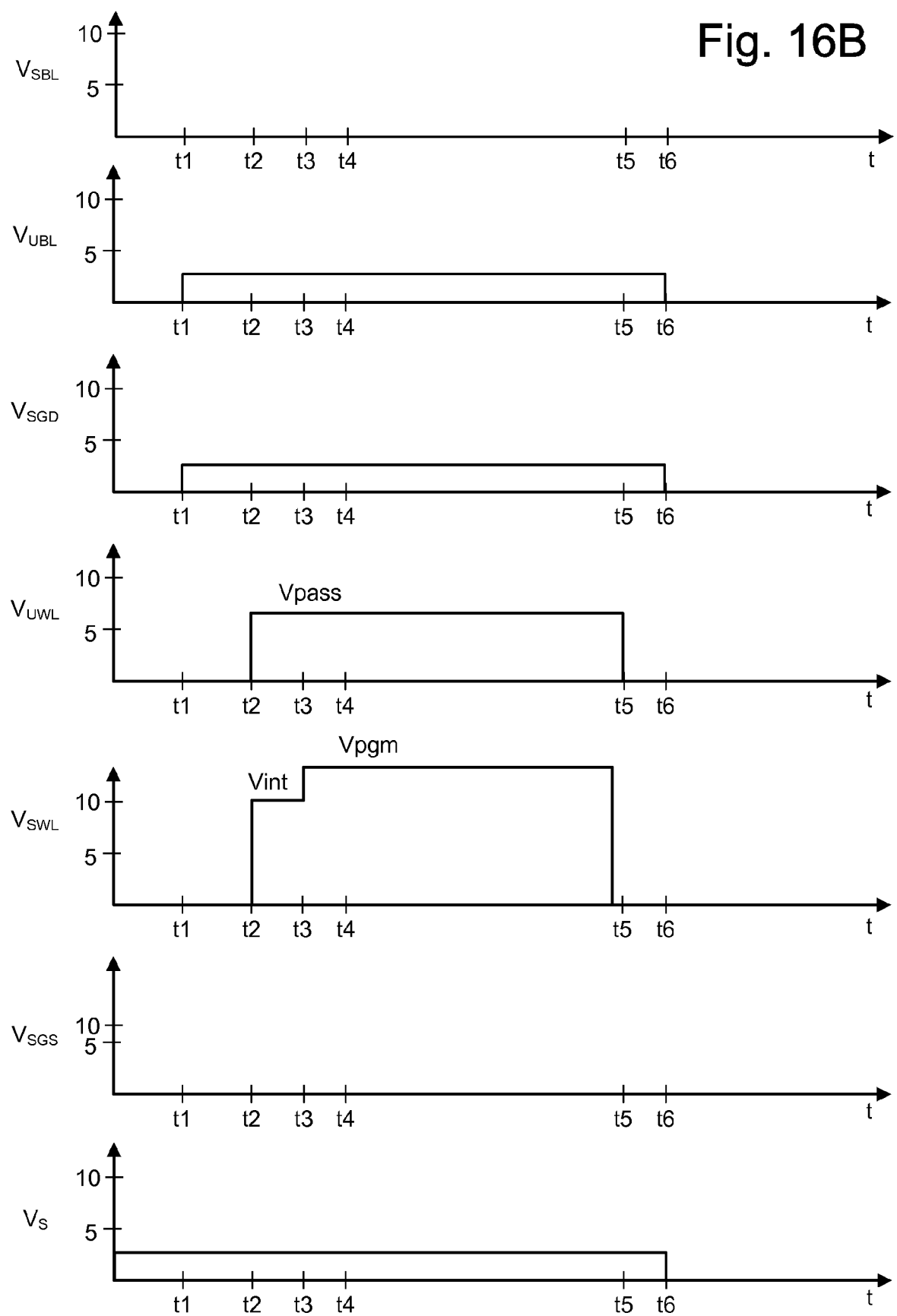
FIG. 16B is a timing diagram that explains the behavior of certain signals during a programming operations.

FIG. 16B is a timing diagram describing another example of the timing for applying the various signals used during programming. In one embodiment, FIG. 16B depicts the operation during one iteration of step 660 of FIG. 13 for the programming pulse of FIG. 14B. In FIG. 16B, the signals $V_{UBL}$, $V_{SBL}$, $V_{SGD}$, $V_{UWL}$, $V_{SGS}$ and $V_S$ operate the same as depicted in FIG. 16A. However, the voltage pulse of $V_{SWL}$ is different. The voltage $V_{SWL}$ on the selected word line is raised to Vint at t2 as the voltage applied to the unselected word lines is raised to Vpass at t2. At t3, the voltage $V_{SWL}$ on the selected word line is raised to Vpgm, which is the target magnitude of the programming pulse. $V_{SWL}$ is lowered to 0 volts at t5. As can be seen from FIG. 16, Vpgm>Vint>Vpass. In the embodiment where select gate voltage $V_{SGD}$ is raised to 5 volts at t1 and then lowered to Vdd at t2, $V_{SWL}$ is raised to Vdd at t1 to allow pre-charging and then is raised to Vint at t2.

Note that the exact timing of the various signals described above with respect to FIGS. 16A and 16B can be varied as per the particular implementation. Also the signal are depicted as straight lines and right angles to simplify the discussion. However, the actual signal will rise and fall more gradually.

In one embodiment, after an erase operation a block of memory cells are programmed based on an order that includes programming the memory cells connected to WL0, followed programming the memory cells connected to WL1, followed programming the memory cells connected to WL2, . . . , followed programming the memory cells connected to WLX, where WLX is the word lines closest to the bit line contact. Thus, while programming a block, the word line that is the selected word line will change. First, the selected word line will be WL0, then WL1, . . . In each iteration, the selected word line will received $V_{SWL}$ depicted in FIGS. 16A or 16B.

FIG. 16C shows an alternative waveform for $V_{swl}$ used with prior devices. The voltage $V_{SWL}$ on the selected word line is raised to Vpass at t2 as the voltage applied to the selected word lines is also raised to Vpass t2. At t3, the voltage $V_{SWL}$ on the selected word line is raised to Vpgm, which is the target magnitude of the programming pulse. $V_{SWL}$ is lowered to 0 volts at t5. The waveform of 16C can be used with the other waveforms of FIG. 16A.

In one embodiment, when WL0 is selected for programming, then $V_{swl}$ will be as depicted in FIGS. 16A or 16B. When word lines other than WL0 are selected for programming, then $V_{swl}$ will be as depicted in FIG. 16C. Thus, in this embodiment, Vint is only used for WL0.

In other embodiments, Vint can be used for word lines other than or in addition to WL0. GIDL can occur during the programming of the selected word line WLn (where WLN is WL0, WL1, WL2 or another word line) when a relatively low voltage is applied on WLn-1 (the word line next to WLn and previously programmed) and the memory cell connected to WLn-1 has been programmed to a relatively high threshold voltage. Thus, the scheme of FIGS. 16A and 16B can be used for programming all word lines and is not limited to programming WL0.

Figure 1:
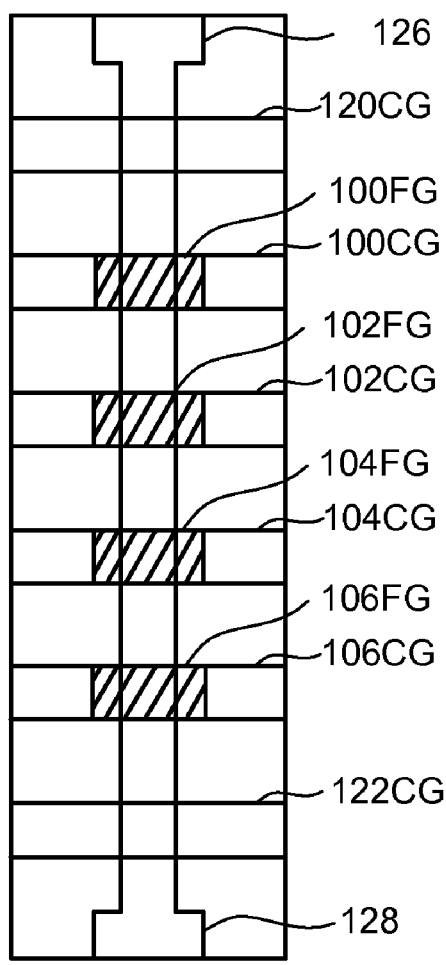
FIG. 1 is a top view of a NAND string.
Figure 2:
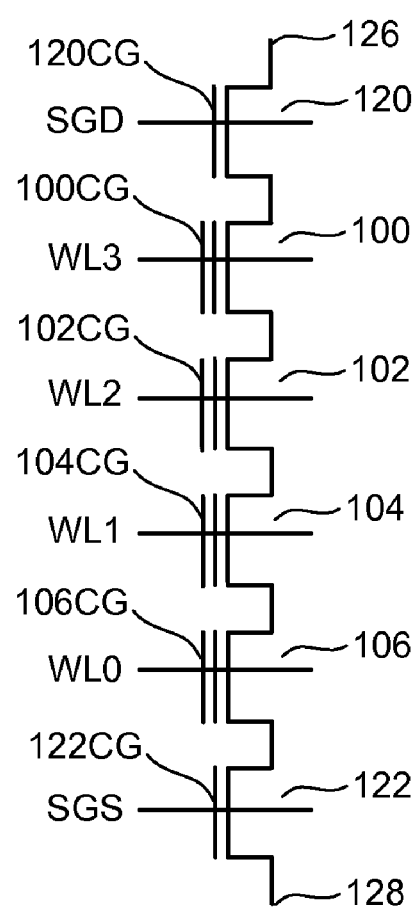
FIG. 2 is an equivalent circuit diagram of the NAND string.
Figure 5:
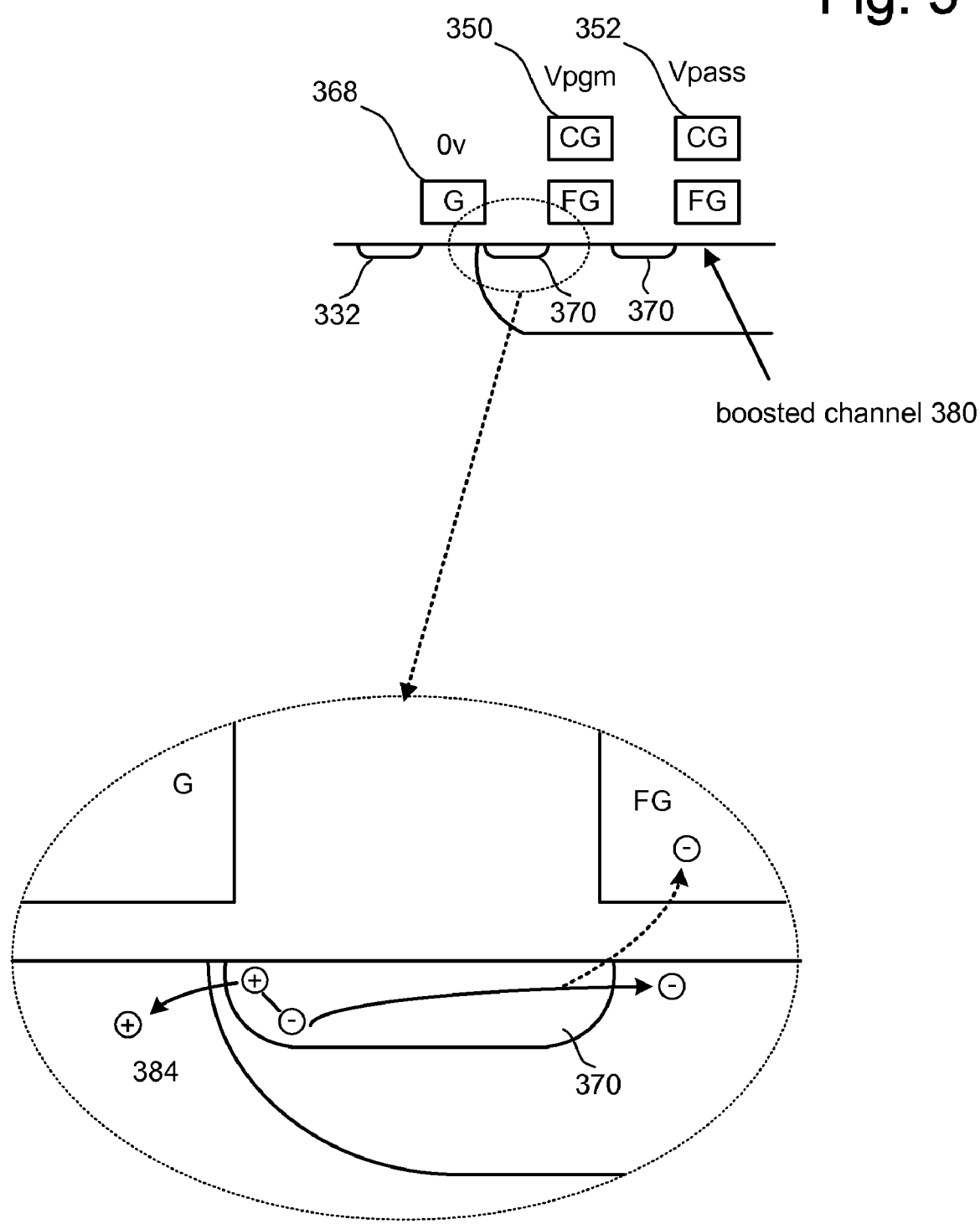
FIG. 5 depicts a portion of a NAND string.

As described above with respect to FIG. 5, GIDL can be a cause of program disturb. Because of a difference in potential between the source side select gate and the channel of the memory cell next to the source side select gate, a current flows. This current serves to reduce the voltage of the channel of the memory cell next to the source side select gate so that the difference of potential will be reduced and the current GIDL will slow down or stop.

It has been observed that when a memory cell connected to WL0 (e.g., memory cell 350 of FIGS. 4 and 5), is programmed or partially programmed, the memory cell may not conduct sufficiently in response to Vpass so that the channel under memory cell 350 does not boost to a large enough voltage to cause GIDL. When prior devices ramp up the selected word line voltage from Vpass to Vpgm, GIDL takes place while there is a strong electric field capable of causing the electrons flowing from GIDL to be injected in to the floating gate of memory cell 350.

The use of Vint can reduce the problem described above. When the selected word line voltage changes from Vpass to Vint, GIDL takes place and a current will flow. However, because Vint is being used instead of Vpgm, the electric field will be smaller and, thus, not able to cause enough electrons to be injected into the floating gate or dielectric to change the threshold voltage of the memory cell. As GIDL takes place during the period of time when Vint is applied, the voltage of the channel of memory cell 350 will be reduced so that the current is reduced or eliminated. When the selected word line voltage changes from Vint to Vpgm, the channel voltage will not increase significantly; therefore, there will be little or no current flow from GIDL (which had already stopped or slowed down). Since there will be little or no current flow from GIDL, the electric field from the application of Vpgm will not be able to cause many electrons flowing from GIDL to be injected into the floating gate of memory cell 350 (which is supposed to be inhibited from programming). Therefore, the use of the new waveform for $V_{swl}$ can reduce program disturb.

In one embodiment, Vint is 3-4 volts lower than Vpgm. Vint needs to be high enough to guarantee that the memory cells receiving Vint at the control gate turn on and are sufficiently boosted. However, Vint should be low enough to prevent programming and low enough so that the vertical electric field does not cause electrons from GIDL to be injected into the floating gate or dielectric of the memory cell.

Note that because Vint is 3-4 volts lower than Vpgm, the difference in potential between the floating gate and channel of the selected memory cell will be lower when Vint is applied then when Vpgm is applied. The lower difference in potential does not facilitate programming.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
   a plurality of non-volatile storage elements including a selected non-volatile storage element, a first unselected non-volatile storage element and other unselected non-volatile storage elements; and
   one or more managing circuits in communication with said non-volatile storage elements, said one or more managing circuits apply a set of pulses to said selected non-volatile storage element and said first unselected non-volatile storage element, each pulse has a first portion with a first magnitude, an intermediate portion with an intermediate magnitude, and a second portion with a second magnitude, said intermediate magnitude is greater than said first magnitude and less than second magnitude, said one or more managing circuits increase said first magnitude, said intermediate magnitude, and said second magnitude with each successive pulse, said first magnitude and said intermediate magnitude are not large enough to intentionally cause programming of said selected non-volatile storage element, said second magnitude is large enough to cause programming of said selected non-volatile storage element, said one or more managing circuits apply other signals to said other unselected non-volatile storage elements.

2. A non-volatile storage system according to claim 1, further comprising:
   a selection line connected to said selected non-volatile storage element and said first unselected non-volatile storage element.

3. A non-volatile storage system according to claim 1, further comprising:
   a set of word lines including a first word line and other word lines, said first word line is connected to said selected non-volatile storage element and said first unselected non-volatile storage element, said other word lines are connected to said other unselected non-volatile storage elements, said selected non-volatile storage element and a first subset of said other unselected non-volatile storage elements are on a first NAND string, said first unselected non-volatile storage element and a second subset of said other unselected non-volatile storage elements are on a second NAND string; and
   a set of bit lines including a first bit line connected to said first NAND string and a second bit line connected to said second NAND string.

4. A non-volatile storage system according to claim 3, wherein:
   said one or more managing circuits program a different non-volatile storage element of said first NAND string including applying a different set of pulses to said different non-volatile storage element, said different set of pulses do not include said second magnitude, said selected non-volatile storage element is first to be programmed for said first NAND string since a last erase.

5. A non-volatile storage system according to claim 1, wherein:
   for each pulse of said set, said first magnitude is lower than said second magnitude by a constant value.

6. A non-volatile storage system according to claim 1, wherein:
   said selected non-volatile storage element experiences programming in response to said second magnitude; and
   said first unselected non-volatile storage element does not intentionally experience programming in response to said second magnitude.

7. A non-volatile storage system according to claim 1, wherein:
   said one or more managing circuits apply other signals to other unselected non-volatile storage elements by applying a voltage at said first magnitude to said other unselected non-volatile storage elements.

8. A non-volatile storage system according to claim 1, wherein:
   said selected non-volatile storage element and a first subset of said other unselected non-volatile storage elements are flash memory devices on a first NAND string;

said first unselected non-volatile storage element and a second subset of said other unselected non-volatile storage elements are flash memory devices on a second NAND string; and said selected non-volatile storage element and said first unselected non-volatile storage element are connected to a common selection line.

9. A non-volatile storage system according to claim 1, wherein:

said first unselected non-volatile storage element does not intentionally experience programming in response to said second magnitude; and said one or more managing circuits program a different non-volatile storage element of said first NAND string including applying a different set of pulses to said different non-volatile storage element, said different set of pulses do not include said second magnitude, said selected non-volatile storage element is first to be programmed for said first NAND string since a last erase.

10. A non-volatile storage system according to claim 1, wherein:

said one or more managing circuits apply said other signals to said other unselected non-volatile storage elements at said first magnitude.

11. A non-volatile storage system according to claim 1, wherein:

said first magnitude is lower than said second magnitude by a constant voltage for each of said pulses.

12. A non-volatile storage system according to claim 1 , wherein:

said plurality of non-volatile storage elements are multi-state NAND flash memory devices.

13. A non-volatile storage system, comprising:

a plurality of non-volatile storage elements including a selected non-volatile storage element, a first unselected non-volatile storage element and other unselected non-volatile storage elements; and a common selection line connected to said selected non-volatile storage element and said first unselected non-volatile storage element;

a first NAND string having flash memory devices comprising the selected non-volatile storage element and a first subset of said other unselected non-volatile storage a second NAND string having flash memory devices comprising the first unselected non-volatile storage element and a second subset of said other unselected non-volatile storage elements; and one or more managing circuits in communication with said non-volatile storage elements, said one or more managing circuits apply a set of pulses to said selected non-volatile storage element and said first unselected non-volatile storage element, each pulse has a first intermediate magnitude and a second intermediate magnitude and a target magnitude, said second intermediate magnitude is greater than said first intermediate magnitude and less than said target magnitude, said one or more managing circuits increase said target magnitude for at least a subset of successive pulses, said first intermediate magnitude and said second intermediate magnitude are not large enough to intentionally cause programming of said selected non-volatile storage element, said selected non-volatile storage element experiences programming in response to said target magnitude, said one or more managing circuits apply other signals at a magnitude lower than said second intermediate magnitude to said other unselected non-volatile storage elements while applying said second intermediate magnitude during said pulses, said one or more managing circuits program a different non-volatile storage element of said first NAND string including applying a different set of pulses to said different non-volatile storage element, said different set of pulses do not include a second intermediate magnitude, said selected non-volatile storage element is first to be programmed for said first NAND string since a last erase.

14. A non-volatile storage system according to claim 13, wherein:

said first unselected non-volatile storage element does not experience programming in response to said target magnitude.

15. A non-volatile storage system according to claim 13, wherein:

said one or more managing circuits increase said second intermediate magnitude for at least a subset of successive pulses; and said second intermediate magnitude is lower than said target magnitude by a constant voltage for all of said pulses.

16. A non-volatile storage system according to claim 13, wherein:

said applying other signals includes applying a voltage at said first intermediate magnitude to said other unselected non-volatile storage elements.

17. A non-volatile storage system, comprising:

a plurality of non-volatile storage elements including a selected non-volatile storage element, a first unselected non-volatile storage element and other unselected non-volatile storage elements; and one or more managing circuits in communication with said non-volatile storage elements, said one or more managing circuits apply a programming signal as a set of pulses to said selected non-volatile storage element and said first unselected non-volatile storage element, wherein each pulse has a first magnitude, a second magnitude, and a third magnitude, said applying said programming signal includes adjusting said programming signal to the first magnitude and holding said programming signal at said first magnitude for a first period of time and adjusting said programming signal to the second magnitude and holding said programming signal at said second magnitude for a second period of time, said one or more managing circuits do not intentionally cause programming of said selected non-volatile storage element when applying said programming signal at said first magnitude and at said second magnitude, said applying said programming signal further includes adjusting said programming signal to the third magnitude to intentionally cause said selected non-volatile storage element to experience programming, said one or more managing circuits apply other signals at a magnitude lower than said second magnitude to said other unselected non-volatile storage elements while applying said programming signal at said second magnitude.

18. A non-volatile storage system according to claim 17, wherein:

said one or more managing circuits apply a set of other signals at said first magnitude to other unselected non-volatile storage elements, while applying said programming signal, in order to boost a channel region associated with said first unselected non-volatile storage element, said boosting said channel region associated with said first unselected non-volatile storage element inhibits programming of said first unselected non-volatile storage element, said second magnitude is greater than said first magnitude and less than said third magnitude; and said first unselected non-volatile storage element does not experience programming in response to adjusting said programming signal to said third magnitude.

19. A non-volatile storage system according to claim 18, wherein:

said selected non-volatile storage element and a first subset of said other unselected non-volatile storage elements are flash memory devices on a first NAND string;

said first unselected non-volatile storage element and a second subset of said other unselected non-volatile storage elements are flash memory devices on a second NAND string;

said selected non-volatile storage element and said first unselected non-volatile storage element are connected to a common word line; and said first unselected non-volatile storage element and said other unselected non-volatile storage elements are not intentionally programmed in response to said adjusting said programming signal to said third magnitude.

20. A non-volatile storage system according to claim 17, wherein:

said third magnitude increases for successive pulses; and
said second magnitude increases for successive pulses.

21. A non-volatile storage system according to claim 17, wherein:

said selected non-volatile storage element and said first unselected non-volatile storage element are multi-state flash memory devices.

* * * * *

UNITED STATES PATENT AND TRADEMARK OFFICE
CERTIFICATE OF CORRECTION

PATENT NO. : 7,706,189 B2  Page 1 of 1
APPLICATION NO. : 11/753963
DATED : April 27, 2010
INVENTOR(S) : Dong et al.

It is certified that error appears in the above-identified patent and that said Letters Patent is hereby corrected as shown below:

Col. 21, line 45: After "storage" and before "a" insert --elements;--

Signed and Sealed this

Seventeenth Day of August, 2010

David J. Kappos
*Director of the United States Patent and Trademark Office*